(12) United States Patent
Matsuyama

(10) Patent No.: US 10,833,212 B2
(45) Date of Patent: Nov. 10, 2020

(54) SOLAR CELL AND METHOD FOR MANUFACTURING SOLAR CELL

(71) Applicant: Panasonic Intellectual Property Management Co., Ltd., Osaka (JP)

(72) Inventor: Kenta Matsuyama, Kadoma (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/657,987

(22) Filed: Jul. 24, 2017

(65) Prior Publication Data

US 2018/0040747 A1 Feb. 8, 2018

(30) Foreign Application Priority Data

Aug. 8, 2016 (JP) ................................. 2016-155419

(51) Int. Cl.
*H01L 31/0236* (2006.01)
*H01L 31/0747* (2012.01)
(Continued)

(52) U.S. Cl.
CPC .... *H01L 31/02363* (2013.01); *H01L 31/0288* (2013.01); *H01L 31/03762* (2013.01);
(Continued)

(58) Field of Classification Search
CPC ........... H01L 31/0236; H01L 31/02363; H01L 31/03529; H01L 31/035281;
(Continued)

(56) References Cited

U.S. PATENT DOCUMENTS

| 6,207,890 B1* | 3/2001 | Nakai | ............... H01L 31/03529 136/246 |
| 2002/0011590 A1* | 1/2002 | Nagashima | ........... H01L 31/028 252/500 |

(Continued)

FOREIGN PATENT DOCUMENTS

| CN | 102165606 A | 8/2011 |
| CN | 102484168 A | 5/2012 |

(Continued)

OTHER PUBLICATIONS

JP 2014093418A English machine translation (Year: 2014).*

(Continued)

*Primary Examiner* — Andrew J Golden
(74) *Attorney, Agent, or Firm* — Westerman, Hattori, Daniels & Adrian, LLP

(57) ABSTRACT

A solar cell is made which has a first conduction-type crystalline silicon substrate having a texture provided on the surface, and an i-type amorphous silicon layer located on the surface of the crystalline silicon substrate, wherein the texture has a larger radius of curvature R1 of root parts thereof than the radius of curvature R2 of peak parts thereof. The crystalline silicon substrate has a first conduction-type highly-doped region containing a first conduction-type dopant on the surface thereof, and the dopant concentration in the first conduction-type highly-doped region is higher than that in the center in the thickness direction of the crystalline silicon substrate.

15 Claims, 2 Drawing Sheets

(51) Int. Cl.
*H01L 31/18* (2006.01)
*H01L 31/0288* (2006.01)
*H01L 31/0376* (2006.01)
*H01L 31/20* (2006.01)
*H01L 31/0352* (2006.01)

(52) U.S. Cl.
CPC ...... *H01L 31/0747* (2013.01); *H01L 31/1804* (2013.01); *H01L 31/202* (2013.01); *H01L 31/03529* (2013.01); *Y02E 10/50* (2013.01); *Y02P 70/521* (2015.11)

(58) Field of Classification Search
CPC ........... H01L 31/0747; H01L 31/03762; H01L 31/028; H01L 31/0288; H01L 31/1804; H01L 31/202; H01L 31/74
USPC .................................................. 136/243–265
See application file for complete search history.

(56) References Cited

U.S. PATENT DOCUMENTS

| | | | | |
|---|---|---|---|---|
| 2008/0173347 | A1* | 7/2008 | Korevaar | H01L 31/0747 136/255 |
| 2009/0286347 | A1* | 11/2009 | Kim | H01L 31/03529 438/72 |
| 2010/0154869 | A1* | 6/2010 | Oh | H01L 31/022425 136/252 |
| 2011/0174371 | A1 | 7/2011 | Olibet et al. | |
| 2011/0174374 | A1 | 7/2011 | Harder | |
| 2011/0272012 | A1* | 11/2011 | Heng | H01L 31/0745 136/255 |
| 2012/0181667 | A1 | 7/2012 | Geerligs et al. | |
| 2012/0204948 | A1 | 8/2012 | Barton et al. | |
| 2012/0273036 | A1 | 11/2012 | Motoyoshi et al. | |
| 2014/0090701 | A1* | 4/2014 | Rim | H01L 31/035272 136/256 |
| 2015/0075601 | A1* | 3/2015 | Adachi | H01L 31/022425 136/256 |
| 2015/0372165 | A1 | 12/2015 | Harada et al. | |
| 2016/0268459 | A1* | 9/2016 | Kimoto | H01L 31/0747 |
| 2017/0200852 | A1* | 7/2017 | Uto | H01L 31/0236 |

FOREIGN PATENT DOCUMENTS

| | | | | |
|---|---|---|---|---|
| DE | 10 2008 030 693 A1 | | 1/2010 | |
| JP | 08204214 A | * | 8/1996 | |
| JP | 2011-009733 A | | 1/2011 | |
| JP | 2012-238853 A | | 12/2012 | |
| JP | 2014093418 A | * | 5/2014 | |
| JP | 2014-192426 A | | 10/2014 | |
| JP | WO 2015060437 A1 | * | 4/2015 | ......... H01L 31/0747 |
| WO | 2014/175066 A1 | | 10/2014 | |
| WO | 2015/159456 A1 | | 10/2015 | |
| WO | 2016/052635 A1 | | 4/2016 | |
| WO | WO-2016052635 A1 | * | 4/2016 | ......... H01L 31/0236 |

OTHER PUBLICATIONS

JP 08204214A English machine translation (Year: 1996).*
Office Action dated Oct. 26, 2018, issued in counterpart Chinese application No. 201710671160.2, with English translation. (17 pages).
Office Action dated Jun. 27, 2019, issued in counterpart CN application No. 201710671160.2, with English translation. (12 pages).
Office Action dated Oct. 21, 2019, issued in counterpart DE Application No. 10 2017 117 877.5, with English translation. (12 pages).
Office Action dated Feb. 25, 2020, issued in counterpart CN Application No. 201710671160.2, with English Translation. (19 pages).

* cited by examiner

SOLAR CELL AND METHOD FOR MANUFACTURING SOLAR CELL

CROSS REFERENCE TO RELATED APPLICATION

The entire disclosure of Japanese Patent Application No. 2016-155419 filed on Aug. 8, 2016, including specification, claims, drawings and abstract, is incorporated herein by reference in its entirety.

TECHNICAL FIELD

The present disclosure relates to a solar cell and a method for manufacturing a solar cell.

BACKGROUND

Solar cells are known which have a texture, being a rugged structure, provided on the surface thereof. By providing the texture, the reflectance of light is reduced, and the power generation efficiency can be enhanced due to elongation of the optical path length in the power generation layer. In order to reduce the light reflection amount from the transparent conductive layer surface, for example, a method is known in which a silicon substrate surface is treated with an alkaline solution or an acidic solution to thereby form the texture by utilizing the difference in the wet etching speed depending on the plane direction.

As illustrated in FIG. 4, in a solar cell in which the surface of a silicon substrate 50 is provided with a texture, light incident on the silicon substrate 50 refracts and converges at a peak part (the tip part of the texture indicated by hatching in the figure) of a rugged structure. Therefore, the density of carriers produced becomes higher in the peak part of the texture than in the other regions. Also in such solar cells, there are demanded solar cells in which the recombination of high-density carriers is suppressed as far as possible and that have further improved output.

An object of the present disclosure is to provide, in the case of using a silicon substrate having a texture, a solar cell having improved lifetime of carriers in the vicinity of the surface of the silicon substrate, and a method for manufacturing the same.

SUMMARY

One aspect of the present disclosure is a solar cell having a first conduction-type crystalline silicon substrate having a texture provided on a surface thereof, and an amorphous silicon layer located on the surface of the crystalline silicon substrate, wherein the texture has a larger radius of curvature of root parts thereof than that of peak parts thereof; the crystalline silicon substrate has a first conduction-type highly-doped region having a first conduction-type dopant, on the surface; and the first conduction-type highly-doped region has a higher dopant concentration than that in the central part in the thickness direction of the crystalline silicon substrate.

Further another aspect of the present disclosure is a method for manufacturing a solar cell comprising a first step of forming a texture on a surface of a first conduction-type crystalline silicon substrate; a second step of diffusing a first conduction-type dopant on the surface of the silicon substrate having the texture formed thereon so that the surface has a higher dopant concentration than that in the central part in the thickness direction of the silicon substrate; and a third step of forming an amorphous silicon layer on the surface side of the silicon substrate having the texture formed thereon, wherein, in the first step, the texture is formed so that root parts thereof have a larger radius of curvature than peak parts thereof.

BRIEF DESCRIPTION OF DRAWINGS

Embodiments of the present disclosure will be described based on the following figures, wherein.

DESCRIPTION OF EMBODIMENTS

Figure 1:
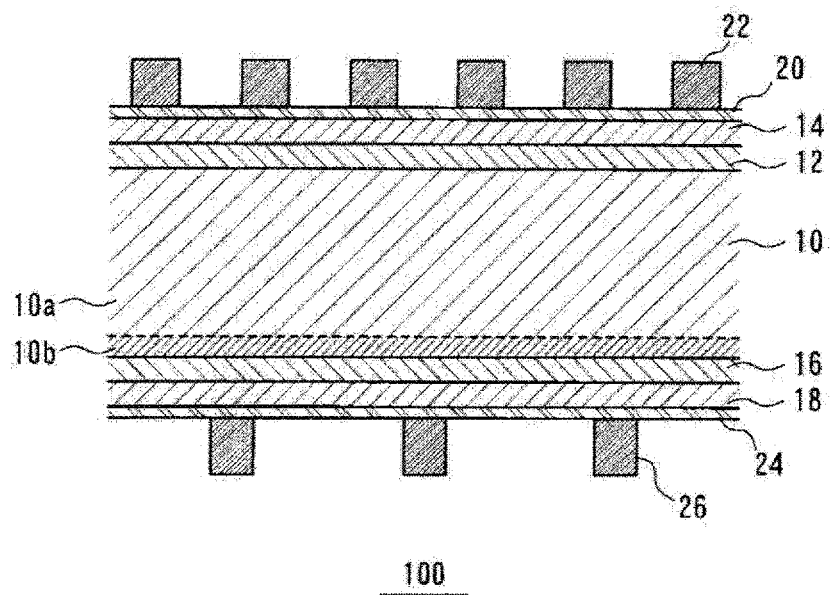
FIG. 1 is a cross-sectional schematic view illustrating a structure of a solar cell in an embodiment of the present invention.

Hereinafter, embodiments according to the present disclosure (hereinafter, referred to as embodiments) will be described in detail by reference to the accompanying drawings. In this description, specific shapes, materials, numerical values, directions and the like are exemplifications for facilitating the understanding of the present disclosure, and can be suitably changed according to applications, objects, specifications and the like. Further in the case of including a plurality of embodiments and modified examples in the following, it is assumed from the start to use characteristic parts thereof by suitably combining them. Further, the drawings referred to in descriptions of embodiments are schematically illustrated, and dimensional ratios and the like of constituent elements drawn in the drawings are different from those of actual items in some cases.

FIG. 1 is a schematic cross-sectional view of a solar cell 100. As illustrated in FIG. 1, the solar cell 100 has an n-type, as a first conduction-type, crystalline silicon substrate (hereinafter, referred to as silicon substrate) 10, a first i-type amorphous silicon layer 12, a p-type, as a second conduction-type, amorphous silicon layer (hereinafter, referred to as p-type amorphous silicon layer) 14, a second i-type amorphous silicon layer 16, and an n-type amorphous silicon layer 18.

The silicon substrate 10 may be an n-type polycrystal silicon substrate, but is preferably an n-type single-crystal silicon substrate. In the present embodiment, the silicon substrate 10 is used in which the plane directions of the front surface and the rear surface are (100) planes in the stage before an etching step described later is carried out.

The first i-type amorphous silicon layer 12 is provided on a first principal surface of the silicon substrate 10. Further the p-type amorphous silicon layer 14 is provided on the first principal surface side of the silicon substrate 10. In detail, the p-type amorphous silicon layer 14 is provided on the opposite side to the silicon substrate 10 side of the first i-type amorphous silicon layer 12. The second i-type amorphous silicon layer 16 is provided on a second principal surface of the silicon substrate 10. The n-type amorphous silicon layer 18 is provided on the opposite side to the silicon substrate 10 side of the second i-type amorphous silicon layer 16.

The first i-type amorphous silicon layer 12, the p-type amorphous silicon layer 14, the second i-type amorphous silicon layer 16 and the n-type amorphous silicon layer 18 have a function of suppressing the recombination of photo-produced carriers. These silicon layers 12, 14, 16 and 18 are suitably deposited by a chemical vapor deposition (CVD) method, particularly a plasma CVD method. As a raw material gas to be used for the deposition of the silicon layers 12, 14, 16 and 18, a silicon-containing gas of $SiH_4$, $Si_2H_6$ and the like, or a mixture of these gases with $H_2$ is suitably used. As a dopant gas to form the p-type or n-type amorphous silicon layers 14 or 18, for example, $B_2H_6$ or $PH_3$ is suitably used. The amount of impurities added, such as P and B, need only be trace amounts, and a mixed gas with $SiH_4$, $H_2$ or the like can also be used.

The first and second i-type amorphous silicon layers 12 and 16 are preferably i-type hydrogenated amorphous silicon layers (i-type a-Si:H); and the p-type amorphous silicon layer 14 is preferably a p-type hydrogenated amorphous silicon layer (p-type a-Si:H). Further, the n-type amorphous silicon layer 18 is preferably an n-type hydrogenated amorphous silicon layer (n-type a-Si:H). The i-type a-Si:H layer can be deposited by a CVD method using a raw material gas of $SiH_4$ diluted with $H_2$. The deposition of the p-type a-Si:H layer uses a raw material gas of $SiH_4$ added with $B_2H_6$ and diluted with hydrogen. The deposition of the n-type a-Si:H layer uses the raw material gas containing $PH_3$ in place of $B_2H_6$. Here, each of the amorphous silicon layers 12, 14, 16 and 18 does not necessarily need to be hydrogenated. Further, the deposition method of each of the semiconductor layers is not especially limited.

The solar cell 100 is supposed to receive light from the n-type amorphous silicon layer 18 side. As illustrated in FIG. 1, the solar cell 100 has, on the rear surface side of the opposite side to the light incident side, a transparent conductive layer 20 and a rear side collector electrode 22 in this order on the p-type amorphous silicon layer 14. Further the solar cell 100 has, on the front surface side, being the light incident side, a transparent conductive layer 24 and a front side collector electrode 26 in this order on the n-type amorphous silicon layer 18. The transparent conductive layer 20 is formed over almost the entire region of the rear surface of the p-type amorphous silicon layer 14, and the transparent conductive layer 24 is formed over almost the entire region of the front side surface of the n-type amorphous silicon layer 18. Each of the transparent conductive layers 20 and 24 has transparency and conductivity. Each of the transparent conductive layers 20 and 24 is constituted of a metal oxide such as $In_2O_3$, ZnO, $SnO_2$ or $TiO_2$. These metal oxides may be doped with a dopant such as Sn, Zn, W, Sb, Ti, Ce, Zr, Mo, Al or Ga.

The rear side collector electrode 22 and the front side collector electrode 26 are formed, for example, by screen-printing a pattern containing a large number of finger parts, and busbar parts fewer in number than the finger parts, with a conductive paste. The rear side collector electrode 22 is formed preferably in a larger area than the front side collector electrode 26, and the finger parts of the rear side collector electrode 22 are formed preferably more in number than the finger parts of the front side collector electrode 26. Here, since the structures of the electrodes are not especially limited, for example, the rear surface side collector electrode may be constituted of a metal layer formed over almost the entire area of the transparent conductive layer.

The solar cell 100 is supposed to receive light from the n-type amorphous silicon layer 18 side, but the solar cell may receive light from the p-type amorphous silicon layer 14 side. Further the solar cell may receive light from both of the p-type amorphous silicon layer 14 side and the n-type amorphous silicon layer 18 side.

Further on the surface of the silicon substrate 10, a texture is provided. The texture refers to a rugged structure of the surface for suppressing the surface reflection to increase the light absorbing amount of the silicon substrate 10. The texture is formed, for example, only on the light incident surface, or on both of the light incident surface and the rear surface.

The texture structure can be formed by applying acid etching or alkali etching to etch the surface of the silicon substrate 10. The acid etching can be carried out by using an aqueous solution containing, for example, hydrofluoric acid and an oxidizing agent (nitric acid or chromic acid). The alkali etching can be carried out by using an aqueous solution containing, for example, hydrazine (NH), sodium hydroxide (NaOH) and potassium hydroxide (KOH).

For example, in the case where the silicon substrate 10 is a single-crystal silicon substrate having the surface of the (100) plane in the stage before the etching treatment is carried out, by applying anisotropic etching, there is formed a texture being a rugged structure of pyramid-shapes whose (111) planes are made to be slant surfaces thereof. The height of the texture is, for example, 1 μm to 10 μm.

After the texture is formed on the single-crystal silicon substrate, when the silicon substrate is further subjected to a treatment using a nitro-fluoric acid (a mixed acid of hydrofluoric acid and nitric acid), root parts of the texture can be rounded. By rounding tip parts and root parts of the texture, it is possible to suppress the chipping of the tip parts of the texture and the cracking from the root parts thereof of the solar cell when the solar cell is subjected to impacts.

Figure 2:
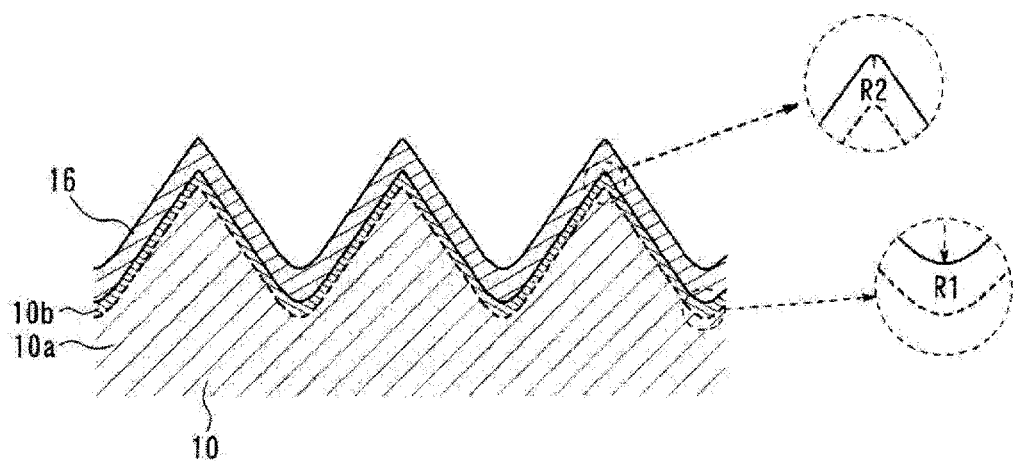
FIG. 2 is an enlarged cross-sectional schematic view illustrating a structure of a solar cell in an embodiment of the present invention.

In the present embodiment, as illustrated in the enlarged cross-sectional view of FIG. 2, in the rugged structure of the texture, the radius of curvature R1 of the root parts is formed larger than the radius of curvature R2 of the peak parts. Here, the root parts mean tip parts of valleys in the texture, and the peak parts mean tip parts of ridges in the texture. That is, in the present embodiment, in the rugged structure of the texture, the root parts are made to have a gentler shape than the peak parts. The upper limit value of the radius of curvature R1 of the root parts is not especially limited, but is suitably made to be a value that does not substantially reduce the optical action of the texture.

As illustrated in FIG. 2, the silicon substrate 10 has a lowly-doped region 10*a* and a second principal surface-side highly-doped region 10*b*. The lowly-doped region 10*a* is doped into an n-type. Further the second principal surface-side highly-doped region 10*b* is provided between the lowly-doped region 10*a* and the second i-type amorphous silicon layer 16 to become the light incident surface side. The second principal surface-side highly-doped region 10*b* is an $n^+$ region where an n-type dopant is doped in a higher amount than in the lowly-doped region 10*a*. That is, the second principal surface-side highly-doped region 10*b* has a higher n-type dopant concentration than the lowly-doped region 10*a*. The second principal surface-side highly-doped region 10*b* is provided on the entire surface on the n-type amorphous silicon layer 18 side of the lowly-doped region 10*a*.

The second principal surface-side highly-doped region 10*b* is formed by using an ion implantation method, a thermal diffusion method, a plasma doping method or an epitaxial growth method. As an n-type dopant, P (phosphorus), As (arsenic), Sb (antimony) and the like are used, and particularly, P is suitably used.

For example, P (phosphorus) can be doped on the surface of the silicon substrate 10 having a texture formed thereon in the state of having suppressed defect generation by carrying out a heat treatment with a POCl$_3$ gas mixed, on the surface. Further in the case of using an ion implantation method, in order to reduce defects generated in the ion implantation, a high-temperature annealing or RTA (Rapid Thermal Annealing) is preferably used in combination. Besides, the second principal surface-side highly-doped region 10b may be formed by forming diffusion sources on the silicon substrate by a wet process, and thereafter diffusing P (phosphorus) or the like to the surface of the silicon substrate by a heat treatment.

Here, the doping profile of the second principal surface-side highly-doped region 10b will be described. In the case where a dopant is diffused to the silicon substrate 10, different doping profiles can be obtained depending on the plane directions. In the present embodiment, in the case of doping P (phosphorus) in the silicon substrate 10, P (phosphorus) more easily diffuses into the (100) plane than into the (111) plane, and under the same thermal diffusion conditions (for example, 850° C., 1 hour), the (100) plane gives a longer diffusion length of the dopant and a higher dopant concentration than the (111) plane.

In the present embodiment, in the rugged structure of the silicon substrate 10, the texture is formed so that the radius of curvature R1 of the root parts becomes larger than the radius of curvature R2 of the peak parts. The slant surfaces of the texture are (111) planes, and in the root parts of the rugged structure having a large radius of curvature R1, regions having plane directions near the (100) plane extend more than the other regions. Therefore, the dopant more easily diffuses in the depth direction in the root parts of the texture by the thermal diffusion during the doping time than in the other regions. That is, the second principal surface-side highly-doped region 10b becomes thick in the root parts and becomes high in dopant concentration.

For example, in the case where the layer thickness of the second principal surface-side highly-doped region 10b is about 50 nm in the regions other than the root parts, the layer thickness of the second principal surface-side highly-doped region 10b can be made to be about 100 nm in the root part regions.

However, the relation of the layer thickness of the second principal surface-side highly-doped region 10b is not limited thereto, and it suffices if the layer thickness of the second principal surface-side highly-doped region 10b is made larger in regions near the root parts of the texture than the other regions thereof. The layer thickness of the second principal surface-side highly-doped region 10b can be suitably regulated by the doping method, the doping conditions and the like.

As described above, by forming the root parts by the treatment after the texture formation so that the radius of curvature of the root parts become large, and increasing the amount of the dopant in the second principal surface-side highly-doped region 10b in the root parts, carriers produced in the peak parts of the texture are efficiently separated and the recombination of the carriers can be suppressed.

Further, the average doping concentration of P (phosphorus) in the lowly-doped region 10a is preferably about $1 \times 10^{14}$ to $1 \times 10^{16}$ cm$^{-3}$, and most preferably $1 \times 10^{14}$ to $1 \times 10^{15}$ cm$^{-3}$. By contrast, the average concentration of P (phosphorus) in the second principal surface-side highly-doped region 10b is suitably made to be about $1 \times 10^{18}$ cm$^{-3}$. In the case where a thermal diffusion method or a plasma doping method is used to form the second principal surface-side highly-doped region 10b, a concentration gradient is formed in which the concentration gradually becomes high as regions in the second principal surface-side highly-doped region 10b are further apart from the lowly-doped region 10a. At this time, the average value of the dopant concentration of the second principal surface-side highly-doped region 10b becomes higher in the root part regions than in the other regions.

Here, although the doping concentration of the lowly-doped region 10a has been determined to be $1 \times 10^{14}$ to $1 \times 10^{16}$ cm$^{-3}$, and that of the second principal surface-side highly-doped region 10b has been determined to be $1 \times 10^{18}$ cm$^{-3}$ or higher, the doping concentrations of these regions are not limited thereto. That is, it suffices if the doping concentration of the second principal surface-side highly-doped region 10b is higher than that of the lowly-doped region 10a. Specifically, the doping concentration of the second principal surface-side highly-doped region 10b is preferably about 100 times to 1,000 times that of the lowly-doped region 10a.

The solar cell 100 according to the present embodiment can achieve an enhanced power generation efficiency compared to conventional solar cells. This is presumed to be due to the following action.

Figure 3:
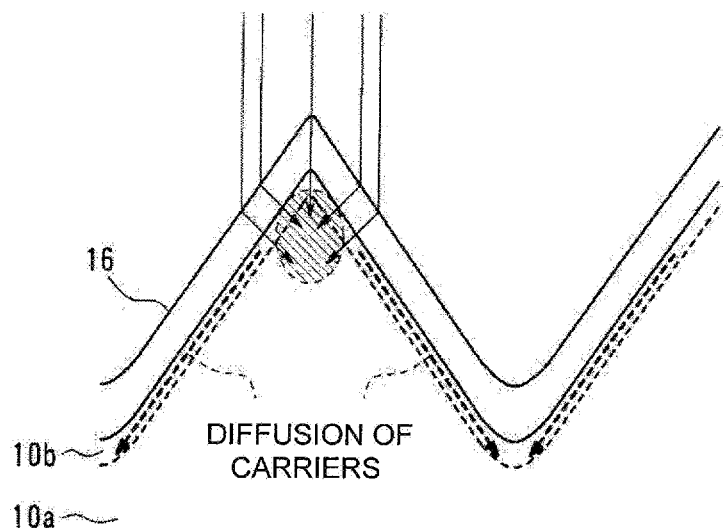
FIG. 3 is a view for interpreting an action of a solar cell in an embodiment of the present invention.
Figure 4:
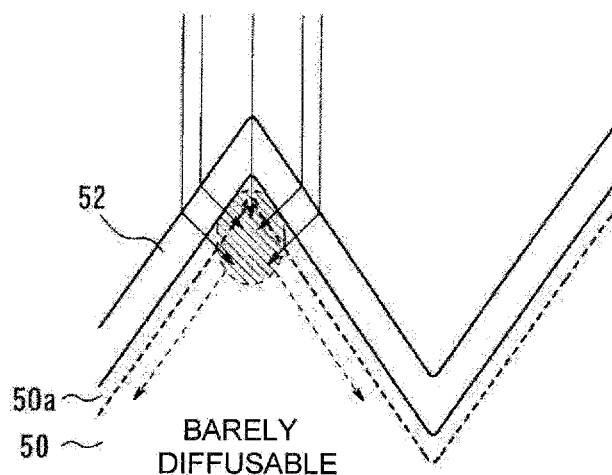
FIG. 4 is a view for interpreting an action of a solar cell in a related art.

As illustrated in FIG. 3, light entering the silicon substrate 10 refracts and converges on a peak part (a tip part of the texture illustrated in hatching in figure) of the rugged structure. Therefore, the density of carriers produced in the peak part of the texture becomes higher than in the other regions. In the solar cell 100 according to the present embodiment, the second principal surface-side highly-doped region 10b provided between the silicon substrate 10 and the second i-type amorphous silicon layer 16 is formed thicker and has a higher doping concentration in the root part of the texture than in the other regions. Since the region where the doping concentration is high has a high conductivity, it becomes easy for carriers produced by entering of light to flow toward the root part to thereby facilitate carrier diffusion. Therefore, the probability of recombination of carriers in the peak part of the texture where the produced carriers concentrate can be made low, to improve the lifetime of the carriers and to thereby enhance the power generation efficiency of the solar cell.

Here, in the present embodiment, there has been described an example in which the second principal surface-side highly-doped region 10b is provided on the entire surface of the n-type amorphous silicon layer 18 side of the lowly-doped region 10a. The second principal surface-side highly-doped region 10b, however, may be provided on a part of the surface of the n-type amorphous silicon layer 18 side of the lowly-doped region. The second principal surface-side highly-doped region 10b may be provided, for example, only on both end parts in the direction nearly orthogonal to the thickness direction, or only in a central part in the nearly orthogonal direction.

Further, although there has been described the use of the second principal surface side, that is, the n-type amorphous silicon layer 18 side as a light incident surface, the use of the first principal surface side, that is, the p-type amorphous silicon layer 14 side as a light incident surface is allowed. In this case, it is allowed if the texture is formed on the first principal surface side of the silicon substrate 10 and the highly doped region 10b where an n-type dopant is doped is provided on the first principal surface side. At this time, by forming the texture so that in the rugged structure of the silicon substrate 10, the radius of curvature R1 of the root parts becomes larger than the radius of curvature R2 of the peak parts, the layer thickness of the highly doped region 10b in the root parts can be made larger than the layer thickness of the highly doped region 10b in the peak parts.

Further, textures may be formed on both of the first principal surface side and the second principal surface side and highly doped regions 10b, where an n-type dopant is doped, may be provided on both surfaces of the first principal surface side and the second principal surface side.

Here, in the above embodiment, it has been described that the first and second i-type amorphous silicon layers 12 and 16 are preferably i-type hydrogenated amorphous silicon layers (i-type a-Si:H), the p-type amorphous silicon layer 14 is preferably a p-type hydrogenated amorphous silicon layer (p-type a-Si:H), and the n-type amorphous silicon layer 18 is preferably an n-type hydrogenated amorphous silicon layer (n-type a-Si:H). These layers (12, 16, 14 and 18), however, are not limited in their materials as long as they are capable of suppressing the recombination on the surface of the silicon substrate 10 and separating conductive carriers produced in the silicon substrate 10 by light irradiation.

For example, in the case where a layer formed on the surface of the silicon substrate 10 is a single layer, in place of the i-type a-Si:H, there may be used the p-type or n-type a-Si:H, or an i-type or p-type or n-type a-SiC:H. In the case where a plurality of layers are laminated as in the above embodiment, on the side near the silicon substrate 10, there is provided the i-type a-Si:H or the i-type a-SiC:H, or a low-concentration layer composed of the p-type or n-type a-Si:H or a-SiC:H. On the i-type layer or low-concentration layer, there may be laminated a high-concentration p-type or n-type a-Si:H, or a p-type or the like. Here, although hydrogenated materials have been exemplified herein, the materials may not be hydrogenated.

Further it is a matter of course that the layer thickness of each layer constituting the solar cell 100 can be suitably varied. For example, the thickness of the silicon substrate 10 can be made to be 50 μm to 300 μm. Further the thicknesses of the recombination-suppressing layers on the first and second principal surface sides of the silicon substrate 10 can be made to be 1 nm to 50 nm, preferably 2 nm to 15 nm.

Further in the present embodiment, there have been described examples in which no protecting layers are formed on the recombination-suppressing layers on the first and second principal surface sides of the silicon substrate 10. However, on at least one of the recombination-suppressing layers on the first and second principal surface sides of the silicon substrate 10, a protecting layer may be formed. The protecting layer has a function of, for example, suppressing a damage to the recombination-suppressing layers and suppressing the reflection of light. The protecting layer is preferably constituted of a material that has high light transmittance, and is suitably constituted of silicon oxide ($SiO_2$), silicon nitride (SiN), silicon oxynitride (SiON) or the like.

As described above, one aspect of the present invention is a solar cell having a first conduction-type crystalline silicon substrate (silicon substrate 10) having a texture provided on a surface thereof, and an amorphous silicon layer (a first i-type amorphous silicon layer 12 or a second i-type amorphous silicon layer 16) located on the surface side of the silicon substrate, wherein the texture has a larger radius of curvature R1 of root parts than the radius of curvature R2 of peak parts, and the silicon substrate (silicon substrate 10) has a first conduction-type doped region (first principal surface-side highly doped region 10b) in which a first conduction-type dopant is doped in the surface layer.

Here, the first conduction-type doped region (first principal surface-side highly doped region 10b) suitably has a larger layer thickness in root parts of the texture than the layer thickness in peak parts thereof.

Further, another aspect of the present invention is a method for manufacturing a solar cell comprising a first step of forming a texture on a surface of a first conduction-type crystalline silicon substrate (silicon substrate 10); a second step of diffusing a first conduction-type dopant to the surface of the silicon substrate (silicon substrate 10) having the texture formed thereon; and a third step of forming an amorphous silicon layer (a first i-type amorphous silicon layer 12 or a second i-type amorphous silicon layer 16) on the surface side of the silicon substrate (silicon substrate 10) having the texture formed thereon, wherein, in the first step, the texture is formed so that root parts thereof have a larger radius of curvature R1 than the radius of curvature R2 of peak parts thereof.

Further, the first conduction-type is suitably an n-type, and the dopant is suitably phosphorus.

Here, the application scope of the present invention is not limited to the above embodiment. That is, the present invention can be applied as long as the solar cell is one having a structure in which a rugged structure of a texture is formed on a substrate surface, and a highly-doped layer is provided on the substrate surface.

The invention claimed is:

1. A solar cell, comprising:
    an n-type crystalline silicon substrate having a texture provided on a principal surface thereof;
    an i-type amorphous silicon layer located on the principal surface of the crystalline silicon substrate;
    a p-type amorphous silicon layer located on the i-type amorphous silicon layer;
    a transparent conductive layer located on the p-type amorphous silicon layer; and
    a collector electrode located on the transparent conductive layer,
    wherein
    the crystalline silicon substrate has an n-type highly-doped region having an n-type dopant, the n-type highly-doped region is located between the i-type amorphous silicon layer and the crystalline silicon substrate,
    the n-type highly-doped region has a higher dopant concentration than a dopant concentration in a central part in the thickness direction of the crystalline silicon substrate,
    the n-type highly doped region has a larger thickness of a root part of the texture than a thickness of a peak part thereof;
    the i-type amorphous silicon layer is located in direct contact with the n-type highly-doped region of the n-type crystalline silicon substrate on the thickness direction of the crystalline silicon substrate,
    the p-type amorphous silicon layer is located in direct contact with the i-type amorphous silicon on the thickness direction of the crystalline silicon substrate,
    the transparent conductive layer is located in direct contact with the p-type amorphous silicon layer on the thickness direction of the crystalline silicon substrate,
    the collector electrode is located in direct contact with the transparent conductive layer on the thickness direction of the crystalline silicon substrate,
    wherein the n-type highly-doped region is provided on an entirety of the principal surface of the crystalline silicon substrate, and
    the root part and the peak part of the texture in the n-type highly-doped region are covered with the i-type amorphous silicon layer, the p-type amorphous silicon layer, and the transparent conductive layer.

2. The solar cell according to claim 1, wherein the texture has a larger radius of curvature of the root part thereof than a radius of curvature of the peak part thereof.

3. The solar cell according to claim 1, wherein the principal surface is on a light incident surface side, and the n-type highly-doped region is provided on the light incident surface side of the crystalline silicon substrate.

4. The solar cell according to claim 2, wherein the principal surface is on a light incident surface side, and the n-type highly-doped region is provided on the light incident surface side of the crystalline silicon substrate.

5. The solar cell according to claim 1, wherein the principal surface is on a rear surface side, and the n-type highly-doped region is provided on the rear surface side of the crystalline silicon substrate.

6. The solar cell according to claim 2, wherein the principal surface is on a rear surface side, and the n-type highly-doped region is provided on the rear surface side of the crystalline silicon substrate.

7. A method for manufacturing a solar cell, comprising:
a first step of forming a texture on a principal surface of an n-type crystalline silicon substrate;
a second step of diffusing an n-type dopant on the principal surface of the silicon substrate having the texture formed thereon so that the principal surface has a n-type dopant concentration region higher than an n-type dopant concentration in a central part in the thickness direction of the silicon substrate; and
a third step of forming an i-type amorphous silicon layer and a p-type amorphous silicon layer in this order so as to directly overlap the higher n-type dopant concentration region of the principal surface of the silicon substrate having the texture formed thereon,
wherein, in the first step, the texture is formed so that a root part of the texture has a larger radius of curvature than a radius of curvature of a peak part thereof,
in the second step, the n-type dopant on the principal surface of the silicon substrate is diffusing so that the n-type dopant on the principal surface of the silicon substrate has a larger thickness of the root part of the texture than a thickness of the peak part thereof,
in the third step, the i-type amorphous silicon layer and p-type amorphous silicon layer are formed at the center of the principal surface of the n-type crystalline silicon substrate,
wherein the higher n-type dopant concentration region is provided on an entirety of the principal surface of the crystalline silicon substrate, and
the root part and the peak part of the texture in the higher n-type dopant concentration region are covered with the i-type amorphous silicon layer, the p-type amorphous silicon layer, and a transparent conductive layer.

8. The solar cell according to claim 1, wherein the crystalline silicon substrate has another principal surface opposite to the principal surface, and comprises another i-type amorphous silicon layer located on the other principal surface of the crystalline silicon substrate, and an n-type amorphous silicon layer located on the other i-type amorphous silicon layer.

9. A solar cell, comprising:
an n-type crystalline silicon substrate having a texture provided on a principal surface thereof;
an i-type amorphous silicon layer located on the principal surface of the crystalline silicon substrate;
a p-type amorphous silicon layer located on the i-type amorphous silicon layer;
a transparent conductive layer located on the p-type amorphous silicon layer; and
a collector electrode located on the transparent conductive layer,
wherein
the crystalline silicon substrate has an n-type highly-doped region having n-type dopant, the n-type highly-doped region is located between the i-type amorphous silicon layer and the crystalline silicon substrate,
the n-type highly-doped region has a higher dopant concentration than a dopant concentration in a central part in the thickness direction of the crystalline silicon substrate,
the n-type highly doped region has a larger thickness of a root part of the texture than a thickness of a peak part thereof,
the n-type silicon substrate, the i-type amorphous silicon layer, the p-type amorphous silicon layer and the transparent conductive layer are located in this order in the thickness direction of the crystalline silicon substrate at the center of the principal surface of the n-type crystalline silicon substrate,
wherein the n-type highly-doped region is provided on an entirety of the principal surface of the crystalline silicon substrate, and
the root part and the peak part of the texture in the n-type highly-doped region are covered with the i-type amorphous silicon layer, the p-type amorphous silicon layer, and the transparent conductive layer.

10. The solar cell according to claim 9, wherein the texture has a large radius of curvature of the root part thereof than a radius of curvature of the peak part thereof.

11. The solar cell according to claim 9, wherein the principal surface is on a light incident surface side, and the n-type highly-doped region is provided on the light incident surface side of the crystalline silicon substrate.

12. The solar cell according to claim 10, wherein the principal surface is on a light incident surface side and the n-type highly-doped region is provided on the light incident surface side of the crystalline silicon substrate.

13. The solar cell according to claim 9, wherein the principal surface is on a rear surface side, and the n-type highly-doped region is provided on the rear surface side of the crystalline silicon substrate.

14. The solar cell according to claim 10, wherein the principle surface is on a rear surface side, and the n-type highly-doped region is provided on the rear surface side of the crystalline silicon substrate.

15. The solar cell according to claim 1, wherein the i-type amorphous silicon layer, the p-type amorphous silicon layer, and the transparent conductive layer directly overlay an entirety of the n-type highly-doped region.

* * * * *